(12) United States Patent
Yeh et al.

(10) Patent No.: US 10,818,515 B2
(45) Date of Patent: Oct. 27, 2020

(54) ELECTRONIC PACKAGE AND METHOD FOR FABRICATING THE SAME

(71) Applicant: Siliconware Precision Industries Co., Ltd., Taichung (TW)

(72) Inventors: Yu-Wei Yeh, Taichung (TW); Yen-Hung Lin, Taichung (TW); Chih-Yi Liao, Taichung (TW); Chih-Hsien Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/196,503

(22) Filed: Nov. 20, 2018

(65) Prior Publication Data

US 2020/0090952 A1 Mar. 19, 2020

(30) Foreign Application Priority Data

Sep. 19, 2018 (TW) .............................. 107132963 A (51) Int. Cl.
*H01L 21/48* (2006.01)
*H01L 23/538* (2006.01)
(Continued)

(52) U.S. Cl.
CPC ............ *H01L 21/486* (2013.01); *H01L 21/56* (2013.01); *H01L 23/3128* (2013.01); *H01L 23/3135* (2013.01); *H01L 23/5384* (2013.01); *H01L 23/5386* (2013.01); *H01L 23/5389* (2013.01); *H01L 24/16* (2013.01); *H01L 24/81* (2013.01); *H01L 25/0652* (2013.01); *H01L 2224/16227* (2013.01)

(58) Field of Classification Search
CPC ... H01L 21/486; H01L 21/56; H01L 23/3128; H01L 23/3135; H01L 23/5384; H01L 23/5386; H01L 23/5389; H01L 24/16; H01L 24/81; H01L 25/0652; H01L 2224/16227
See application file for complete search history.

(56) References Cited

U.S. PATENT DOCUMENTS

2013/0200528 A1* 8/2013 Lin ....................... H01L 21/561
257/774
2014/0103527 A1* 4/2014 Marimuthu ......... H01L 23/3128
257/737

(Continued)

*Primary Examiner* — Fernando L Toledo
*Assistant Examiner* — Neil R Prasad
(74) *Attorney, Agent, or Firm* — Mintz Levin Cohn Ferris Glovsky and Popeo, P.C.; Peter F. Corless; Steven M. Jensen (57) ABSTRACT

The present disclosure provides an electronic package and a method for fabricating the same. A protective layer is formed on a carrier of the electronic component. The electronic component and the protective layer are covered by a covering layer. A through hole is formed in the covering layer and extends through the protective layer, such that a portion of a surface of the carrier is exposed to the through hole. A conductive structure is disposed in the through hole and electrically connected with the carrier. Through the formation of the protective layer, the buffering effect of the protective layer can prevent the laser from directly burning through the covering layer and the protective layer to avoid damages to the carrier.

20 Claims, 5 Drawing Sheets

(51) Int. Cl.
*H01L 23/31* (2006.01)
*H01L 21/56* (2006.01)
H01L 25/065 (2006.01)
H01L 23/00 (2006.01)

(56) References Cited

U.S. PATENT DOCUMENTS

2016/0118333 A1* 4/2016 Lin .................... H01L 25/16
 257/773
2016/0300797 A1* 10/2016 Shim ................ H01L 23/5389
2019/0237382 A1* 8/2019 Kim ................. H01L 21/4857

* cited by examiner

ELECTRONIC PACKAGE AND METHOD FOR FABRICATING THE SAME

CROSS-REFERENCE TO RELATED APPLICATION

This Application claims under 35 U.S.C. § 119(a) the benefit of Taiwanese Patent Application No. 107132963 filed on Sep. 19, 2018. The entire contents of these applications are incorporated herein by reference in their entirety.

BACKGROUND

1. Technical Field

The present disclosure relates to electronic package technologies, and, more particularly, to an electronic package and a method for fabricating the same.

2. Description of Related Art

With the rapid development in electronic industry, electronic products are tending towards high functionality and high performance.

The technology of through molding via (TMV) has been widely used in the manufacturing process of semiconductor packages. It mainly involves using laser to form holes on the surface of the encapsulant to expose the electrical contacts (such as circuits or electrical connection pads).

Figure 1A:
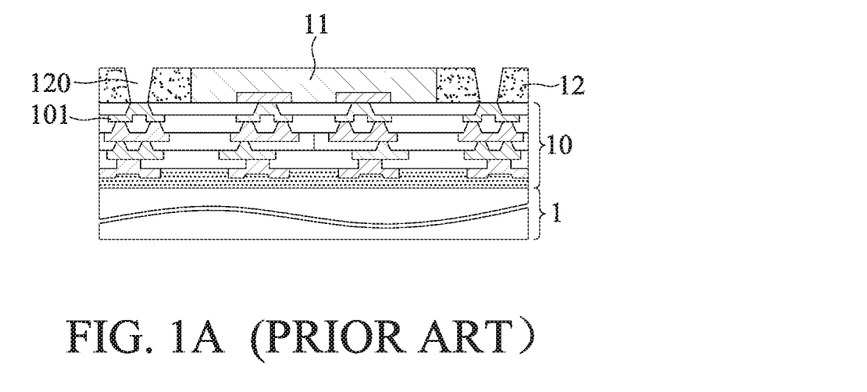
FIG. 1A is a cross-sectional schematic view of a conventional semiconductor package in the manufacturing process.

As shown in FIG. 1A, a packaging substrate having a plurality of circuit layers 101 is formed on a supporting member 1, and the packaging substrate 10 has a chip 11 and an encapsulant 12 encapsulating the chip 11. Then, a plurality of through holes 120 are formed through the encapsulant 12 by a laser drilling method, allowing the circuit layer 101 (i.e., electrical connection pads) to be exposed from the through holes 120. A conductive material, such as copper, is formed in the through hole 120 to function as external connection points. The supporting member 1 is removed. Therefore, the semiconductor package can be mounted via the external connection points to another electronic device, such as a printed circuit board.

Figure 1B:
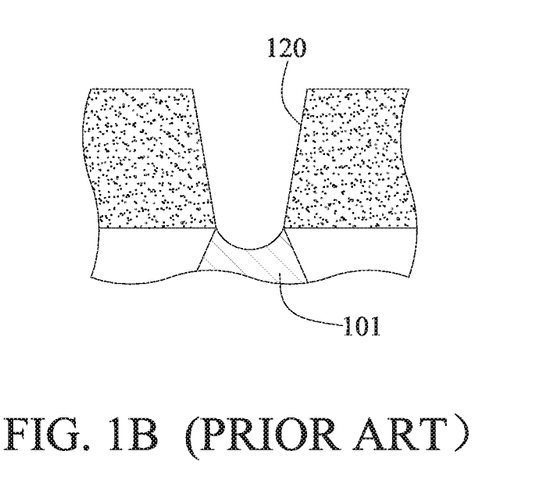
FIG. 1B is a partially enlarged view of FIG. 1A.

However, the conventional method for fabricating the through holes 120 has some drawbacks. It is difficult to control the power and time of laser drilling required to form the through holes 120 (it is required to lower the power or reduce the speed when drilling is near the circuit layer 101), and the circuit layer 101 can be damaged potentially (for instance, the indented surface on the circuit layer 101). Therefore, the conductive material and the circuit layer 101 are poorly electrically connected, resulting in problems such as short circuit or circuit breakage, or even reducing the reliability of the package product.

Accordingly, there is an urgent need to solve the aforementioned drawbacks.

SUMMARY

In view of the foregoing drawbacks of conventional technology, the present disclosure provides an electronic package, comprising: a carrier having a circuit layer exposed from the carrier; an electronic component formed on the carrier; a protective layer formed on the carrier to cover the circuit layer; a covering layer formed on the carrier and covering the electronic component and the protective layer, wherein the covering layer is formed with a through hole penetrating the protective layer, allowing a portion of a surface of the carrier to be exposed from the through hole; and a conductive structure formed in the through hole and electrically connected to the circuit layer of the carrier.

The present disclosure further provides a method for fabricating an electronic package, comprising: disposing an electronic component on a carrier having a circuit layer and forming on the carrier a protective layer that covers the circuit layer; forming a covering layer on the carrier for covering the electronic component and the protective layer; forming a through hole on the covering layer, with a portion of a surface of the carrier being exposed from the through hole; and forming in the through hole a conductive structure electrically connected with the circuit layer of the carrier.

In an embodiment, the through hole is formed by: forming a first opening on the covering layer by using a first laser to expose the protective layer from the first opening; and forming a second opening on the protective layer by using a second laser to expose a portion of a surface of the second side of the carrier from the second opening, wherein the first opening and the second opening serve as the through hole. In another embodiment, the first laser is greater than the second laser in intensity.

In an embodiment, the carrier is a circuit redistribution structure.

In an embodiment, the protective layer covers an upper surface and a lateral surface of the circuit layer. In another embodiment, the protective layer covers the upper surface of the circuit layer.

In an embodiment, the carrier is a packaging substrate.

In an embodiment, the covering layer is made of a different material from that of the protective layer.

In an embodiment, the conductive structure is a solder material or a conductive pillar.

In an embodiment, the protective layer is made of a non-metal material. In an embodiment, the non-metal material is a solder mask layer, an underfill or a combination thereof.

In an embodiment, the electronic package further comprises a circuit structure formed on the covering layer and electrically connected with the conductive structure. In another embodiment, the electronic package further comprises a plurality of conductive elements disposed on the circuit structure.

From the above, the electronic package and the method for fabricating the same according to the present disclosure utilize the design of the protective layer. During the process of forming the through hole, a first laser is first used to remove the covering layer, and a second laser is then used to remove the protective layer. In comparison with the conventional technology, the present disclosure employs the protective layer to provide a buffering effect to prevent the first laser from directly burning through the covering layer and the protective layer, thereby preventing damages to the carrier and thus enhancing the reliability of the electronic package.

BRIEF DESCRIPTION OF THE DRAWINGS

FIGS. 2B' and 2B" are different embodiments of FIG. 2B.

DETAILED DESCRIPTION OF THE EMBODIMENTS

The technical content of present disclosure is described by the following specific embodiments. One of ordinary skill in the art can readily understand the advantages and effects of the present disclosure upon reading the disclosure of this specification. The present disclosure may also be practiced or applied with other different implementations. Based on different contexts and applications, the various details in this specification can be modified and changed without departing from the spirit of the present disclosure.

It should be noted that the structures, ratios, sizes shown in the drawings appended to this specification are to be construed in conjunction with the disclosure of this specification in order to facilitate understanding of those skilled in the art. They are not meant, in any ways, to limit the implementations of the present disclosure, and therefore have no substantial technical meaning. Without affecting the effects created and objectives achieved by the present disclosure, any modifications, changes or adjustments to the structures, ratio relationships or sizes, are to be construed as fall within the range covered by the technical contents disclosed herein. Meanwhile, terms, such as "on", "first", "second", "a", and the like, are for illustrative purposes only, and are not meant to limit the range implementable by the present disclosure. Any changes or adjustments made to their relative relationships, without modifying the substantial technical contents, are also to be construed as within the range implementable by the present disclosure.

FIGS. 2A to 2F are cross-sectional schematic views of an electronic package 2 of an embodiment according to the present disclosure.

Figure 2A:
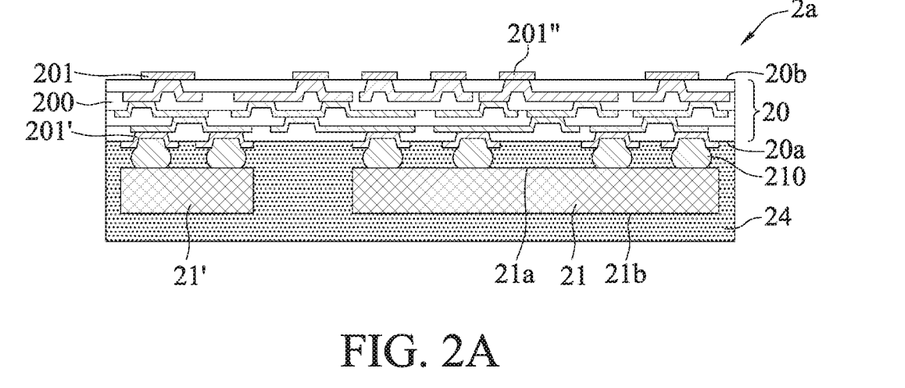
FIGS. 2A to 2F are cross-sectional schematic views of an electronic package of an embodiment according to the present disclosure.

As shown in FIG. 2A, a packaging assembly 2a is provided, comprising a carrier 20, at least a first electronic component 21, 21' and an encapsulating layer 24.

In an embodiment, there are many variations for fabricating the packaging assembly 2a and should not be limited to a particular kind.

The carrier 20 has a first side 20a and a second side 20b opposing to the first side 20a. The carrier 20 comprises at least one first dielectric layer 200 and first circuit layers 201, 201' and 201" coupled to the first dielectric layer 200. In an embodiment, a method using redistribution layer (RDL) is employed to form a coreless structure, formed by the first circuit layers 201, 201', 201" and the first dielectric layer 200. In another embodiment, the first circuit layers 201, 201', 201" are made of copper, and the first dielectric layer 200 is made of a dielectric material, such as polybenzoxazole (PBO), polyimide (PI), prepreg (PP), etc. It should be understood that other carrier units for carrying electronic components, such as chips, may be used as the carrier 20 and should not be limited thereto.

The first electronic components 21, 21' are mounted on the first side 20a of the carrier 20. In an embodiment, the first electronic components 21, 21' are active components, passive components or a combination thereof. In another embodiment, the active component is a semiconductor chip, and the passive component is a resistor, a capacitor or an inductor. In yet another embodiment, the first electronic component 21 is a semiconductor chip having an active side 21a and a non-active side 21b opposing the active side 21a, and the active side 21a is electrically connected to the first circuit layer 201' in a flip-chip manner (via the conductive bumps 210 as shown in the drawing). In an embodiment, the first electronic component 21 is electrically connected to the first circuit layer 201' via wire bonding (not shown). In another embodiment, the first electronic component 21 is in direct contact with the first circuit layer 201'. In still another embodiment, the first electronic component 21' is a passive component and is electrically connected to the first circuit layer 201' via the conductive bumps 210. However, the method of electrically connecting the first electronic components 21, 21' to circuit layers should not be limited to the above-mentioned ways.

The encapsulating layer 24 is formed on the first side 20a of the carrier 20 to encapsulate the first electronic components 21, 21'. In an embodiment, the encapsulating layer 24 is an insulating material, such as polyimide (PI), dry film, or an encapsulant or molding compound made of epoxy, to be formed on the first side 20a of the carrier 20 using a lamination or molding method.

In an embodiment, the encapsulating layer 24 covers the non-active side 21b of the first electronic component 21. In an embodiment, the outer surface of the encapsulating layer 44 is flush with the non-active side 21b of the first electronic component 21, based on the practical needs, with the non-active side 21b of the first electronic component 21 being exposed from the encapsulating layer 44.

Figure 2B:
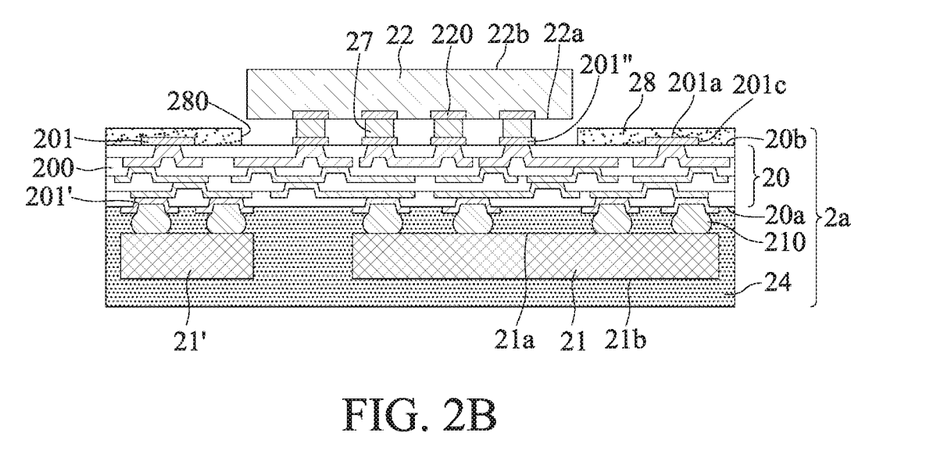

As shown in FIG. 2B, at least one second electronic component 22 is disposed on the second side 20b of the carrier 20, and a protective layer 28 is formed on the second side 20b of the carrier 20.

In an embodiment, the second electronic component 22 is an active component, a passive component or a combination thereof. In another embodiment, the active components are semiconductor components, and passive components are resistors, capacitors or inductors. In an embodiment, the second electronic component 22 is a semiconductor chip having an active side 22a and a non-active side 21b opposing the active side 22a, and the active side 22a has a plurality of electrode pads 220 to electrically connect the second electronic component 22 to the first circuit layer 201 in a flip-chip manner. In an embodiment, the second electronic component 22 is electrically connected to the first circuit layer 201 via wire bonding. IN another embodiment, the second electronic component 22 is in direct contact with the first circuit layer 201". However, the method of electrically connecting the second electronic components to circuit layers should not be limited to the above-mentioned ways.

In an embodiment, a protective layer 28 is formed using a non-mental material, such as solder mask layer (such as green paint), underfill or a combination thereof, on the second side 20b of the carrier 20 first; then, a portion of the protective layer 28 is removed to form an opening 280 to expose a portion of the second side 20b of the carrier 20; and a second electronic component 22 is disposed in the opening 280 and the second electronic component 22 is electrically connected to the first circuit layer 201". In an embodiment, a direct patterned molding method may be employed to form a protective layer 28 on a portion of the first circuit layer 201 of the second side 20b of the carrier 20, without the need to form the opening 280.

In an embodiment, the protective layer 28 covers the upper surface 201a and the lateral surface 201c of the first circuit layer 201. In an embodiment, as shown in FIG. 2B', the protective layer 28 merely covers the upper surface 201a of the first circuit layer 201. In an embodiment, as shown in FIG. 2B, the first circuit layers 201, 201', 201" are embedded in the first dielectric layer 200', and the protective layer 28 is formed on a portion of the surface of the first dielectric layer 200' and covers the upper surface 201a of the first circuit layer 201.

In an embodiment, the active side 21a of the first electronic component 21 and the active side 22a of the second electronic component 22 are disposed in a face-to-face manner.

Figure 2C:
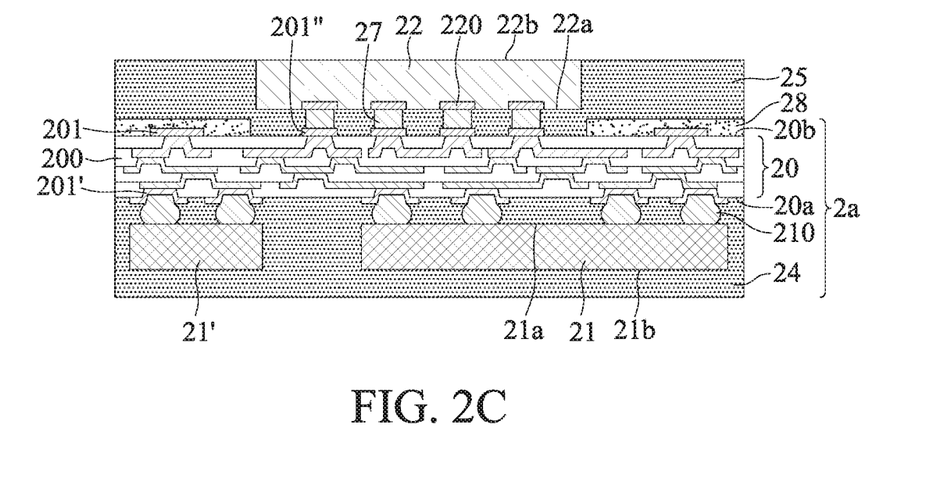

As shown in FIG. 2C, a covering layer 25 is formed on the second side 20b of the carrier 20 and encapsulates the second electronic component 22, the conductive bumps 27 and the protective layer 28.

In an embodiment, the covering layer 25 is an insulating material, such as polyimide (PI), dry film, or an encapsulant or molding compound made of epoxy, to be formed on the second side 20b of the carrier 20 using a lamination or molding method, and the covering layer 25 and the protective layer 28 are made of different materials.

The covering layer 25 and the encapsulating layer 24 are made of the same or different materials.

In an embodiment, a leveling process, such as grinding, is employed to make the outer surface of the covering layer 25 to be flush with the non-active side 22b of the second electronic component 22 to expose the non-active side 22b of the second electronic component 22 from the covering layer 25.

Figure 2D:
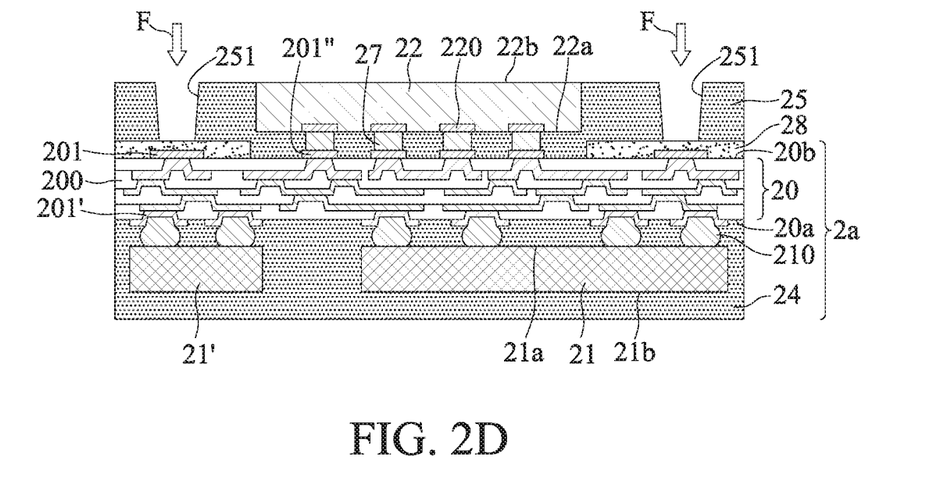

As shown in FIG. 2D, a first laser F is used to form the first opening 251 on the covering layer 25, allowing the protective layer 28 to be exposed from the first opening 251. In an embodiment, the intensity of the first laser F may be controlled by the time employed to prevent it from reaching to the protective layer 28 or to prevent it from going through the protective layer 28.

Figure 2E:
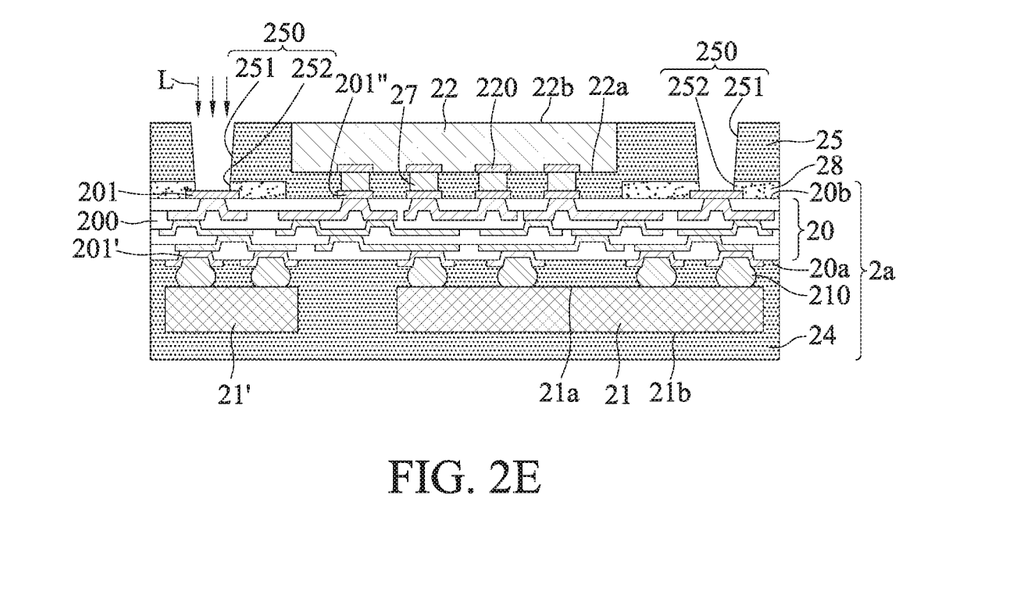

As shown in FIG. 2E, the second layer L is used to form a second opening 252 on the protective layer 28 to expose a portion of the surface of the first circuit layer 201 of the second side 20b of the carrier 20 from the second opening 252. The first opening 251 and the second opening 252 function as a through hole 250. A portion of the surface of the first circuit layer 201 of the second side 20b of the carrier 20 is exposed from the through hole 250.

In an embodiment, the intensity of the first laser F is greater than the intensity of the second laser L. As such, it is easy to control the burning intensity of the second laser L such that the second laser L may penetrate the protective layer 28 without damaging the first circuit layer 201.

In an embodiment, the wall of the first opening 251 and the wall of the second opening 252 form a continuous surface.

Figure 2F:
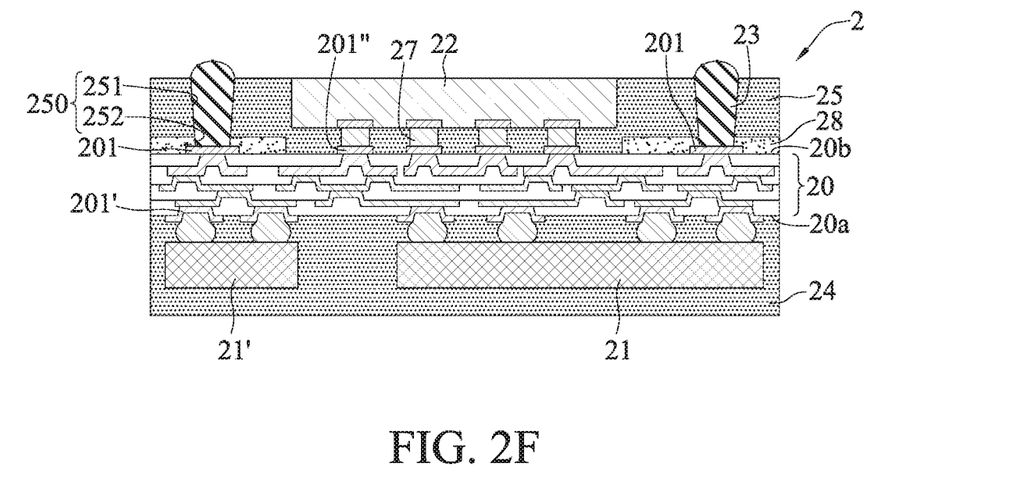

As shown in FIG. 2F, for example, electroplating or depositing method may be employed to form a conductive structure 23 in the through hole 250, and the conductive structure 23 is electrically connected to the first circuit layer 201.

In an embodiment, the conductive structure 23 is made of a solder material and functions as external connection points. In an embodiment, the electronic package 2 is mounted via the external connection points to an electronic device (not shown), such as a printed circuit board, another package structure or another structure (another package or chip).

Figure 3:
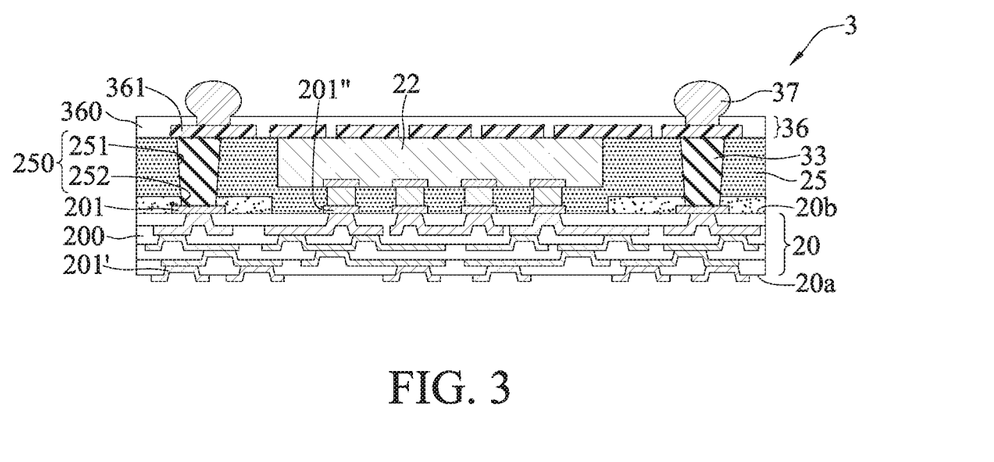
FIG. 3 is a cross-sectional schematic view of another embodiment of FIG. 2F.

In an embodiment, the conductive structure 33 is a metal pillar, such as a copper pillar, as shown in FIG. 3. In another embodiment, a metal material is formed on the covering layer 25 to function as the second circuit layer 361, and the metal material may also be formed in the through hole 250 to be the conductive structure 33, allowing the second circuit layer 361 to be electrically connected with the conductive structure 33 and in contact with the non-active side 22b of the second electronic component 22. Further, according to practical needs, a second dielectric layer 360 may be formed on the covering layer 25 and the second circuit layer 361, with a portion of the second circuit layer 361 exposed from the second dielectric layer 360, and the second circuit layer 361 and the second dielectric layer 360 function as the circuit structure 36, to facilitate the formation of conductive elements 37, such as a plurality of solder balls, in the subsequent processes for mounting the package to another electronic device (not shown), such as a printed circuit board, a packaging structure or other structures (such as another package or chip).

Accordingly, the method according to the present disclosure features on forming a protective layer 28 covering a portion of the first circuit layer 201 such that during the process of forming the through hole 250, a first laser F is first used to remove the covering layer 25 and a second laser L is then used to remove the protective layer 28. In comparison with the conventional technology, the method according to the present disclosure employs the protective layer 28 to provide a buffering effect to prevent the first laser F from directly burning through the covering layer 25 and the protective layer 28, thereby protecting the first circuit layer 201 from being damaged.

As there is no need to consider whether first laser F would damage the first circuit layer 201, the first laser F is not required to be slowed down when it is close to the first circuit layer 201. As such, it would be easy to remove the covering layer 25 and speed up the drilling process using the first laser F.

Also, as the material used for the protective layer 28 is different than that of the covering layer 25, the second laser L can easily remove the protective layer 28 and thereby speed up the laser drilling process.

In addition, it is applicable to omit the packaging process for the first side of the carrier 20, as shown in FIG. 3. In other words, it is not required to dispose the first electronic component 21 and the encapsulating layer 24 on the first side of the carrier 20.

Figure 4:
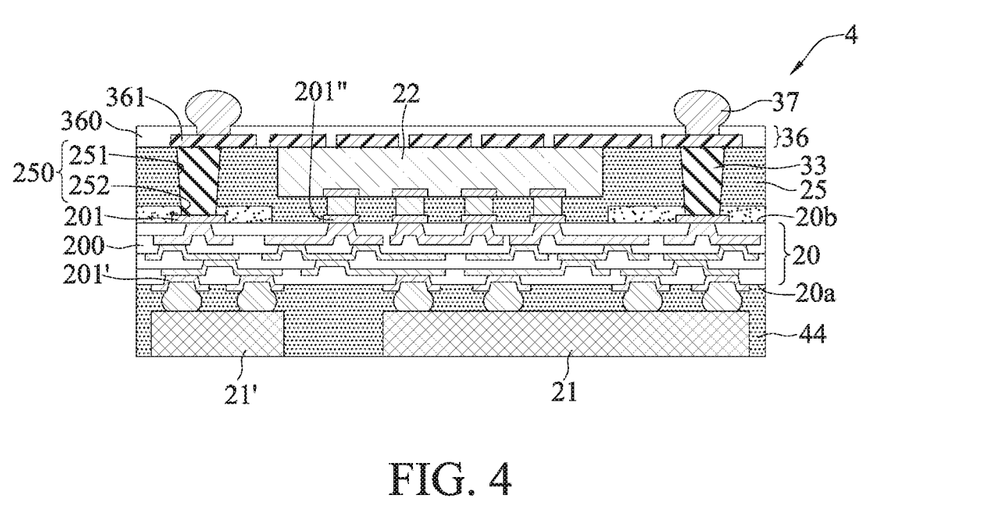
FIG. 4 is a cross-sectional schematic view of another embodiment of FIG. 3.

The present disclosure provides an electronic package 2, 3, 4, comprising a carrier 20, a second electronic component 22, a protective layer 28, a covering layer 25 and conductive structures 23, 33. Further, the electronic package 2, 4 may comprise at least one first electronic components 21, 21' and an encapsulating layer 24, 44.

The carrier 20 has a first side 20a and an opposing second side 20b.

The second electronic component 22 is mounted on the second side 20b of the carrier 20.

The protective layer 28 is mounted on the second side 20b of the carrier 20.

The covering layer 25 is formed on the second side 20b of the carrier 20 for covering the second electronic component 22 and the protective layer 28. In an embodiment, the covering layer 25 has at least a through hole 250 thereon, penetrating the protective layer 28 to allow a portion of the surface of the second side 20b of the carrier 20 to be exposed from the through hole 250.

The conductive structures 23, 33 are formed in the through hole 250 and electrically connected with the carrier 20.

The first electronic components 21, 21' are mounted on the first side 20a of the carrier 20.

The encapsulating layers 24, 44 are formed on the first side 20a of the carrier 20 to encapsulate the first electronic components 21, 21'.

In an embodiment, the carrier 20 has first circuit layers 201, 201', 201" for electrically connecting the first electronic component 21, the second electronic component 22 and conductive structures 23, 33. In an embodiment, the protective layer 28 covers the upper surface 201a and the lateral surface 201c of the first circuit layer 201.

In an embodiment, the carrier 20 is a packaging substrate.

In an embodiment, the non-active side of the second electronic component 22 is exposed from the surface of the covering layer 25.

In an embodiment, the material of the covering layer 25 is different from that of the protective layer 28.

In an embodiment, the protective layer 28 is made of non-metal material, such as solder mask layer, underfill or a combination thereof.

In an embodiment, the conductive structures 23, 33 are made of solder material or are conductive pillars.

In an embodiment, the electronic package 3 further comprises a circuit structure 36 disposed on the covering layer 25 for electrically connecting with the conductive structure 33.

In an embodiment, the second electronic component 22 is in contact with the circuit structure 36. In yet another embodiment, the electronic package 3 further comprises a plurality of conductive elements 37 disposed on the circuit structure 36.

From the above, the electronic package and the method for fabricating the same according to the present disclosure utilize the design of the protective layer, such that during the process of forming the through hole, the first laser can be prevented from directly burning through the covering layer and the protective layer, thereby preventing damages to the first circuit layer and thus enhancing the reliability of the electronic package.

The above embodiments are only used to illustrate the principles of the present disclosure, and should not be construed as to limit the present disclosure in any way. The above embodiments can be modified by those with ordinary skill in the art without departing from the scope of the present disclosure as defined in the following appended claims.

What is claimed is:

1. An electronic package, comprising:
   a carrier having a circuit layer exposed from the carrier;
   an electronic component disposed on the carrier;
   a protective layer formed on the carrier and covering the circuit layer, wherein the protective layer is free from being in contact with the electronic component and has a second opening to expose a portion of the carrier from the second opening;
   a covering layer formed on the carrier and covering the electronic component and the protective layer, wherein the covering layer is formed with a first opening to penetrate the protective layer, and the first opening and the second opening serve as a through hole, with a portion of a surface of the carrier being exposed from the through hole, and a width of the second opening is less than or equal to a width of the first opening; and
   a conductive structure disposed in the through hole and electrically connected with the circuit layer of the carrier.

2. The electronic package of claim 1, wherein the carrier is a circuit redistribution structure.

3. The electronic package of claim 1, wherein the protective layer covers an upper surface of the circuit layer, or the protective layer covers an upper surface and a lateral surface of the circuit layer.

4. The electronic package of claim 1, wherein the carrier is a packaging substrate.

5. The electronic package of claim 1, wherein the protective layer is made of a non-metal material, and the covering layer and the protective layer are made of different materials.

6. The electronic package of claim 5, wherein the non-metal material is a solder mask layer, an underfill, or a combination thereof.

7. The electronic package of claim 1, wherein the conductive structure is a solder material or a conductive pillar.

8. The electronic package of claim 1, further comprising a circuit structure disposed on the covering layer and electrically connected with the conductive structure.

9. The electronic package of claim 8, further comprising a plurality of conductive elements disposed on the circuit structure.

10. A method for fabricating an electronic package, comprising:
    disposing an electronic component on a carrier having a circuit layer, and forming on the carrier a protective layer to cover the circuit layer, wherein the protective layer is free from being in contact with the electronic component;
    forming a covering layer covering the electronic component and the protective layer;
    forming a first opening on the covering layer to expose the protective layer from the first opening;
    forming a second opening on the protective layer to expose a portion of the carrier from the second opening, wherein the first opening and the second opening serve as a through hole, with a portion of the carrier being exposed from the through hole, and a width of the second opening is less than or equal to a width of the first opening; and
    forming in the through hole a conductive structure electrically connected with the circuit layer of the carrier.

11. The method of claim 10, wherein the through hole is formed by:
    forming the first opening on the covering layer by using a first laser to expose the protective layer from the first opening; and
    forming the second opening on the protective layer by using a second laser to expose a portion of the carrier from the second opening.

12. The method of claim 11, wherein the first laser is greater than the second laser in intensity.

13. The method of claim 10, wherein the carrier is a circuit redistribution structure.

14. The method of claim 10, wherein the protective layer covers an upper surface of the circuit layer, or the protective layer covers an upper surface and a lateral surface of the circuit layer.

15. The method of claim 10, wherein the carrier is a packaging substrate.

16. The method of claim 10, wherein the protective layer is made of a non-metal material, and the covering layer and the protective layer are made of different materials.

17. The method of claim 16, wherein the non-metal material is a solder mask layer, an underfill, or a combination thereof.

18. The method of claim 10, wherein the conductive structure is a solder material or a conductive pillar.

19. The method of claim 10, further comprising disposing a circuit structure on the covering layer and electrically connecting the circuit structure with the conductive structure.

20. The method of claim 19, further comprising disposing a plurality of conductive elements on the circuit structure.

\* \* \* \* \*